(12) United States Patent
Mittal et al.

(10) Patent No.: US 9,054,637 B1
(45) Date of Patent: Jun. 9, 2015

(54) AMPLITUDE LIMITING CIRCUIT FOR A CRYSTAL OSCILLATOR

(71) Applicant: STMicroelectronics International N.V., Amsterdam (NL)

(72) Inventors: Gauri Mittal, Ghaziabad (IN); Kallol Chatterjee, Gananagar (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/152,523

(22) Filed: Jan. 10, 2014

(51) Int. Cl.
*H03B 5/36* (2006.01)
*H03B 5/04* (2006.01)
*H03B 5/06* (2006.01)

(52) U.S. Cl.
CPC .............. *H03B 5/364* (2013.01); *H03B 5/04* (2013.01); *H03B 5/06* (2013.01); *H03B 2200/0012* (2013.01); *H03B 2200/0038* (2013.01); *H03B 2200/0066* (2013.01); *H03B 2200/0094* (2013.01)

(58) Field of Classification Search
CPC .......... H03B 5/364; H03B 5/06; H03B 5/04; H03B 2200/0094; H03B 2200/0066; H03B 2200/0038; H03B 2200/0012
USPC ........ 331/116 R, 116 FE, 158, 160, 182, 183, 331/173
See application file for complete search history.

(56) References Cited

U.S. PATENT DOCUMENTS

| | | | |
|---|---|---|---|
| 6,191,662 B1 * | 2/2001 | Volk | 331/158 |
| 6,278,338 B1 | 8/2001 | Jansson | |
| 6,798,301 B1 | 9/2004 | Balan et al. | |
| 7,262,671 B2 | 8/2007 | Maeder | |
| 7,449,972 B2 | 11/2008 | Juang et al. | |
| 7,688,154 B1 | 3/2010 | Fotouhi | |
| 2011/0148533 A1 | 6/2011 | Ramet | |
| 2013/0002365 A1 * | 1/2013 | Zoppi et al. | 331/158 |

OTHER PUBLICATIONS

Vittoz, Eric, et al: "CMOS Analog Integrated Circuits Based on Weak Inversion Operation," IEEE Journal of Solid-State Circuits, vol. SC-12, No. 3, Jun. 1977, pp. 224-231.
Wikipedia, "Pierce Oscillator," http://en.wikipedia.org/wiki/Pierce_oscillator, Nov. 20, 2013 (1 page).

* cited by examiner

*Primary Examiner* — Ryan Johnson
(74) *Attorney, Agent, or Firm* — Gardere Wynne Sewell LLP (57) ABSTRACT

An amplitude limiting circuit for a crystal oscillator circuit includes a current source configured to supply drive current to the crystal oscillator circuit and a current sensing circuit configured to sense operating current in an inverting transistor of the crystal oscillator circuit. The current comparison circuit functions to compare the sensed operating current to at least a reference current and generate an output signal. A current control circuit generates a control signal for controlling operation of the current source in response to the output signal.

20 Claims, 6 Drawing Sheets

AMPLITUDE LIMITING CIRCUIT FOR A CRYSTAL OSCILLATOR

TECHNICAL FIELD

This invention relates generally to crystal oscillator circuits, and more particularly to a circuit for controlling the amplitude of operation for a crystal oscillator circuit.

BACKGROUND

Figure 1:
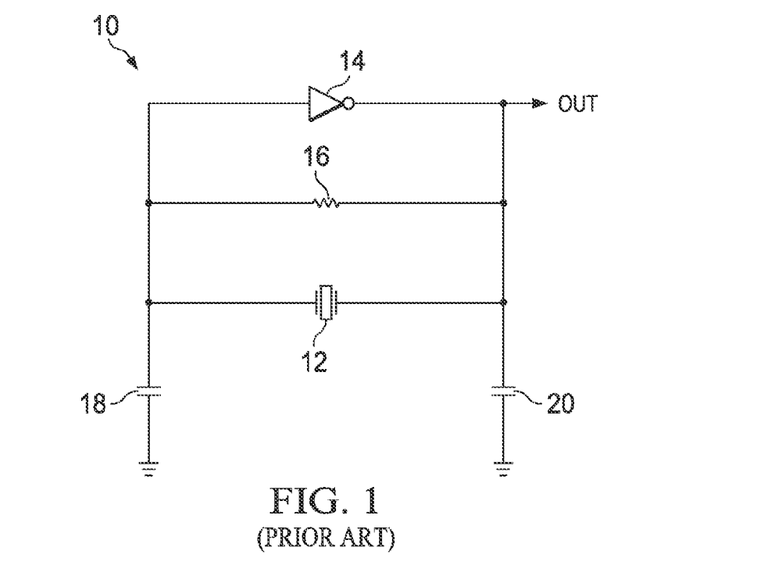
FIGS. 1-3 are circuit diagrams of prior art crystal oscillator circuits.

Reference is made to FIG. 1 which illustrates a basic circuit diagram for a crystal oscillator circuit 10. A crystal resonator 12 is connected between the input and the output of an inverter 14 formed by two complementary transistors (not shown, but understood by those skilled in the art). The output of the oscillator (oscillator output signal OUT) is taken, for example, at the output of the inverter 14. The common mode of the inverter 14 is fixed by a resistor 16 connected between the input and output of the inverter. A frequency correction network comprising two capacitors 18 and 20, respectively connecting the resonator terminals to a reference voltage (such as a ground reference node), enables adjustment of the frequency of oscillator operation.

Figure 2:
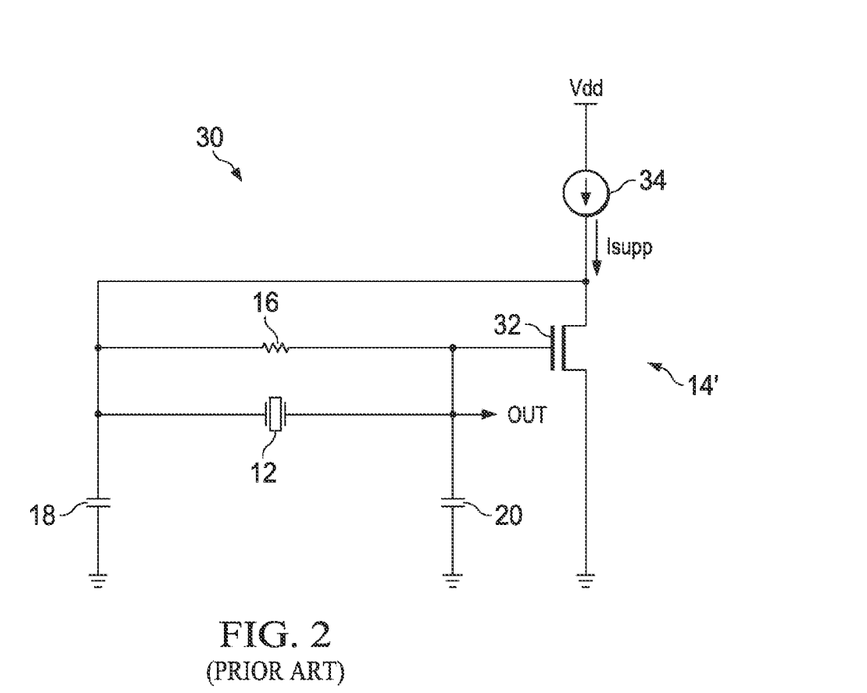

Reference is made to FIG. 2 which illustrates a circuit diagram of a crystal oscillator circuit 30 with a configuration similar to that of FIG. 1. Here, the oscillator circuit 30 differs from the oscillator circuit 10 (FIG. 1) in that the inverter 14' has a different configuration. The inverter 14' comprises an n-channel MOSFET transistor 32 having a source terminal coupled to the ground reference node, a gate terminal coupled to one side of the crystal resonator 12 and a drain terminal coupled to the other side of the crystal resonator. A current source 34 is coupled between a positive supply node (for example, Vdd) and the drain terminal of transistor 32 so as to source current into the drain terminal of transistor 32. The current sourced by current source 34, referred to as the oscillator supply current Isupp, has a magnitude preferably set at the minimum value necessary to maintain oscillation in steady state.

Those skilled in the art understand that the minimum supply current Isupp needed for oscillation is insufficient to achieve a fast start-up of the oscillator circuit 30. Thus, it is known in the art to have current source 34 operate in a variable current mode wherein a relatively higher magnitude current for Isupp is provided at start-up. After oscillation has commenced, the current source switches to source a relatively lower magnitude current, for example the minimum current for oscillator in steady state, for Isupp. The change in current magnitude for Isupp may occur after a predetermined time or after the circuit senses that steady state operation has been reached.

The current source 34 may accordingly comprise a p-channel MOSFET device having its source terminal coupled to the positive supply node, its drain terminal coupled to the drain terminal of the transistor 32 and its gate terminal coupled to receive a variable bias voltage having a magnitude dependent on operating mode, for example, start-up versus steady state operation. See, for example, United States Patent Application Publication No. 2011/0148533 (the disclosure of which is incorporated by reference).

Figure 3:
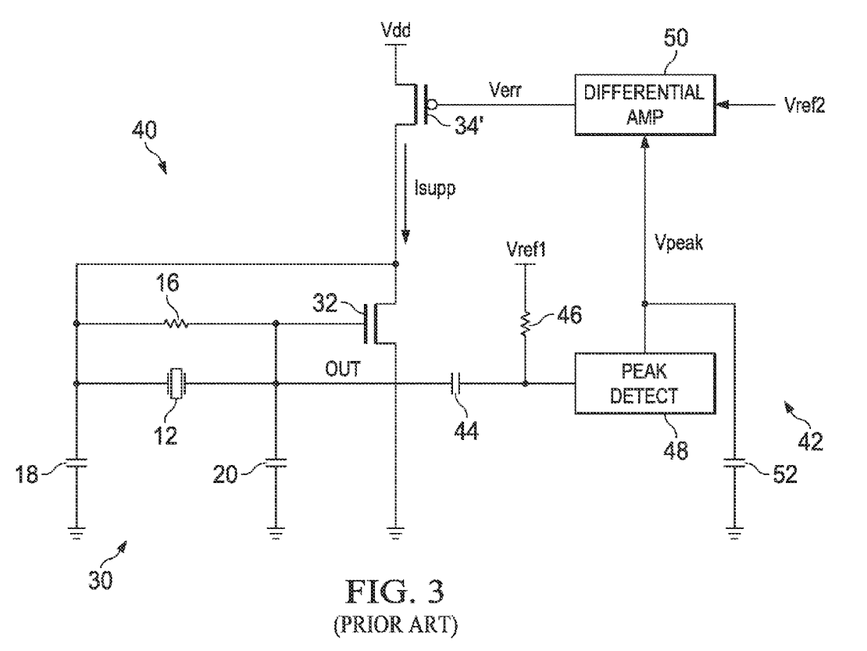

Reference is made to FIG. 3 which illustrates a circuit diagram of a crystal oscillator circuit 40 with a configuration similar to that of FIG. 2. The oscillator circuit 40 is configured with an amplitude limiting circuit 42. The amplitude limiting circuit 42 is coupled through a capacitor 44 to sense the output voltage of the oscillator output signal (OUT). The sensed output voltage is added to a first reference voltage Vref1 supplied through a resistor 46. The resistor 46 and capacitor 44 function as a high pass filter circuit with respect to the oscillator output signal to ensure that the voltage measurement is not perturbed by a DC offset. The peak voltage value of the sensed output voltage is determined by a peak detector circuit 48 and output as the signal Vpeak (the magnitude of this voltage being stored on a capacitor 52). A differential amplifier 50 functions to compare the Vpeak voltage to a second reference voltage Vref2. The differential amplifier 50 functions as an error amplifier in a negative feedback mode. The output Verr from the differential amplifier represents the difference between the Vpeak voltage and second reference voltage Vref2. The voltage Verr is used to bias the gate terminal of a p-channel MOSFET transistor 34' which functions as a variable current source supplying the oscillator supply current Isupp for operation of the oscillator circuit 30. If the Vpeak voltage exceeds the Vref2 voltage, the bias signal Verr increases causing the transistor 34' to source less current to the oscillator 30 resulting in a decrease in the voltage of the oscillating output signal OUT. On the contrary, where Vpeak voltage is less than the Vref2 voltage, the bias signal Verr decreases causing the transistor 34' to source more current to the oscillator 30 resulting in an increase in the voltage of the oscillating output signal OUT. Assuming that the loop gain is sufficient, the amplitude limiting circuit 42 will cause the peak voltage of the oscillating output signal to equal the voltage Vref2−Vref1.

Amplitude limiting circuits like that of FIG. 3 are important because they serve to reduce current consumption of the crystal oscillator 30 to a maximum value equal to that needed to ensure oscillator operation. This is critical in power sensitive applications where the oscillating output signal is always on for supply to on-chip circuitry such as a microprocessor or other digital logic.

Amplitude limiting circuits like that of FIG. 3 are also important because they serve to reduce the drive level of the oscillator crystal, which is proportional to the square of amplitude, and thus reduce aging of the crystal resonator 12.

Amplitude limiting circuits like that of FIG. 3 are still further important because they serve to address and eliminate non-linearity in the oscillating output signal as distortion can be introduced at large signal amplitudes.

There are, however, known drawbacks with respect to the use of circuits like that shown in FIG. 3. One known drawback concerns the need for large resistance and capacitance values for the resistor 46 and capacitors 44 and 52. When the oscillator circuit 40 (with the exception of the crystal 12) is implemented as an integrated circuit, the resistor 46 and capacitors 44 and 52 occupy large amounts of real estate on the die. The circuitry required for implementation of the peak detector circuit 48 can also occupy significant amounts of real estate.

An additional known drawback with respect to certain prior art amplitude limiting circuits is that the current sourced at start-up is not controlled. See, Vittoz, "CMOS Analog Integrated Circuits Based on Weak Inversion Current," IEEE Journal of Solid-State Circuits, vol. SC-12, no. 3, June 1977 (the disclosure of which is incorporated by reference). It is accordingly difficult to ensure that the transistor transconductance lies above a desired range across all process, voltage and temperature (PVT) corners.

Yet another known drawback with respect to certain prior art amplitude limiting circuits is that operation of the circuit is process and temperature dependent. Variation in the regulated value of peak voltage for the oscillator output signal may occur as a function as process and temperature.

There is accordingly a need in the art for an amplitude limiting circuit, for use for example in connection with a crystal oscillator, which is suitable for implementation as an integrated circuit occupying a minimal amount of die real estate. The circuit should also be relatively insensitive to variation in process and temperature.

SUMMARY

In an embodiment, an amplitude limiting circuit for a crystal oscillator circuit comprises: a current source configured to supply drive current to the crystal oscillator circuit; a current sensing circuit configured to sense operating current of the crystal oscillator circuit; a current comparison circuit configured to compare the sensed operating current to a comparison current and generate an output signal; and a current control circuit configured to generate a control signal for controlling operation of the current source in response to said output signal.

In an embodiment, a circuit comprises: an inverting transistor for a crystal oscillator circuit; a first transistor coupled in series with the inverting transistor and configured to supply drive current to the crystal oscillator circuit; a second transistor coupled in a current mirror with the inverting transistor to source a sensed current indicative of an amplitude of an oscillating output of the crystal oscillator circuit; a third transistor coupled in a current mirror with the first transistor to source a bias current; a current source configured to source a reference current; a current comparison circuit coupled to compare a sum of the bias current and reference current to said sensed current and generate an output signal responsive to said comparison; and a control circuit configured to control operation of the first transistor and control a magnitude of the supply drive current in response to said output signal.

In an embodiment, a circuit comprises: an inverting transistor for a crystal oscillator circuit; a first transistor coupled in series with the inverting transistor and configured to supply drive current to the crystal oscillator circuit; a second transistor coupled in a current mirror with the inverting transistor to source a sensed current indicative of crystal oscillator circuit operation; a third transistor coupled in a current mirror with the inverting transistor to source a first bias current; a fourth transistor coupled in series with the third transistor; a fifth transistor coupled in a current mirror with the fourth transistor to source a second bias current; a current source configured to source a reference current; a current comparison circuit coupled to compare the sum of the second bias current and reference current to said sensed current and generate an output signal responsive to said comparison; and a control circuit configured to control operation of the first transistor to set a magnitude of the supply drive current in response to said output signal.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF THE DRAWINGS

Figure 4:
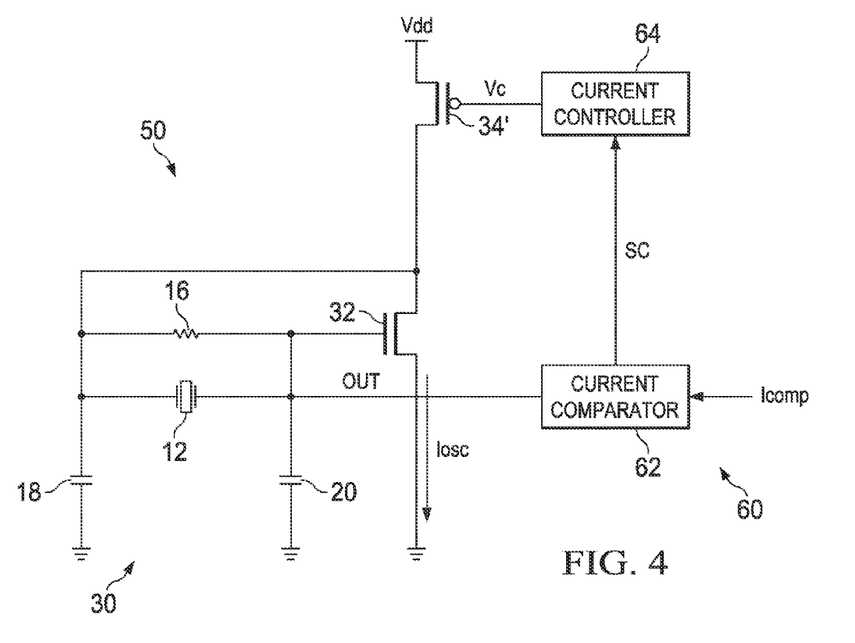
FIG. 4 is a circuit diagram of an embodiment of a crystal oscillator with an amplitude limiting circuit.

Reference is now made to FIG. 4 wherein there is shown a circuit diagram of an embodiment of a circuit 50 comprising a crystal oscillator 30 with an amplitude limiting circuit 60. The crystal oscillator 30 is configured in a manner like that shown in FIG. 3, and thus no further discussion of this part of the circuit is needed. The amplitude limiting circuit 60 comprises a current comparator circuit 62 and a current controller circuit 64.

The current comparator circuit 62 functions to sense the current (Iosc) flowing in transistor 32. That current comprises a DC component and an AC component and the average value of the AC component is proportional to the voltage amplitude of the oscillating output signal OUT for the crystal oscillator 30. The current comparator circuit 62 further functions to compare the sensed current to a comparison current Icomp. There is a portion (referred to herein as the reference current Iref) of the magnitude of the comparison current Icomp that can be set to control the voltage amplitude of the oscillating output signal OUT. The current comparator circuit 62 generates an output signal SC which represents a difference between the sensed current and the comparison current Icomp.

Figure 5:
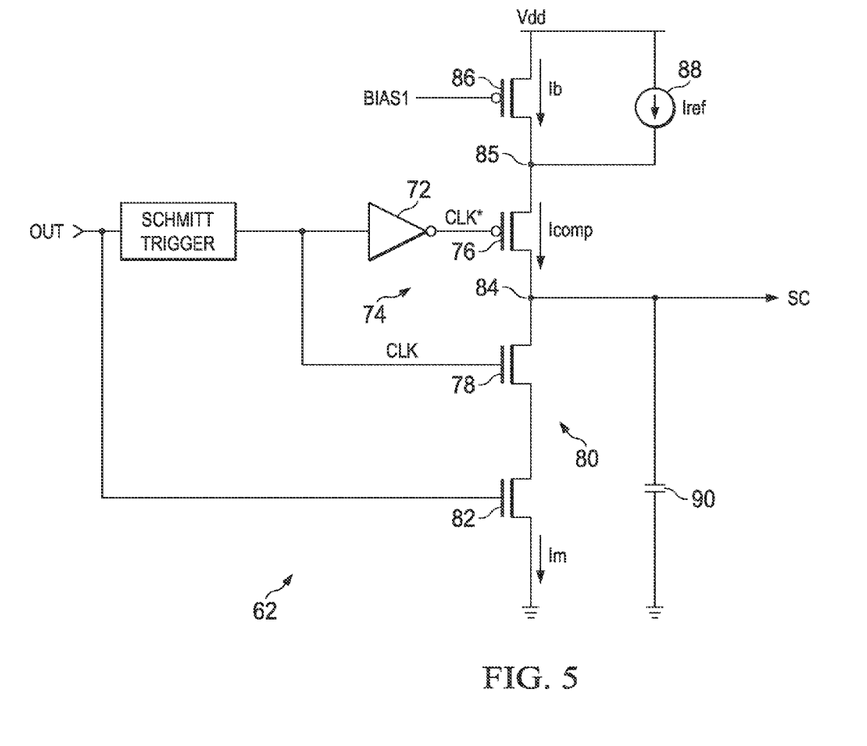
FIG. 5 is a circuit diagram for an embodiment of a current comparator circuit.

Reference is now made to FIG. 5 which shows a circuit diagram for an embodiment of the current comparator circuit 62. The oscillating output signal OUT for the crystal oscillator 30 is received at the input of a non-inverting Schmitt trigger circuit 70. As known to those skilled in the art, the Schmitt trigger circuit 70 functions as a signal conditioning circuit so to generate a full swing clock signal CLK in response to the oscillating output signal OUT. A logic invertor 72 receives the clock signal CLK and generates an inverted clock signal CLK*.

The current comparator circuit 62 further includes a rectifying circuit 74 formed by a p-channel MOSFET transistor 76 and an n-channel MOSFET transistor 78 whose source-drain paths are coupled in series. The gate of the transistor 76 is coupled to receive the inverted clock signal CLK* and the gate of the transistor 78 is coupled to receive the clock signal CLK. The transistors 76 and 78 of the rectifying circuit 74 are accordingly both turned on when the oscillating output signal OUT (and thus the clock signal CLK) is logic high. Conversely, transistors 76 and 78 of the rectifying circuit 74 are both turned off when the oscillating output signal OUT (and thus the clock signal CLK) is logic low.

The current comparator circuit 62 further includes a current sensing circuit provided by an n-channel MOSFET transistor 82. The source terminal of the transistor 82 is coupled to the ground reference node. The gate of transistor 82 receives the oscillating output signal OUT and in particular is coupled to the gate terminal of transistor 32 (see, FIG. 4). The transistors 32 and 82 accordingly form a current mirror circuit as known to those skilled in the art. Transistor 82 has a size scaled to be a small fraction of the size of transistor 32. In the current mirror configuration, the transistor 82 accordingly generates a mirror current Im which is a fractional replica of the current Iosc and thus the circuit functions to sense the oscillator current (and by implication sense the magnitude of the oscillating signal OUT). The transistor 82 has its source-drain path coupled in series with the series coupled source-drain paths of the transistors 76 and 78 of the rectifying circuit 74.

The comparison circuit 80 further includes a current summing node 85. A p-channel MOSFET transistor 86 has its source-drain path coupled to a summing node 85 which is coupled to the comparison node 84 through the rectifying circuit 74. The source of transistor 86 is coupled to the positive supply node and the gate of the transistor 86 is biased by a first bias voltage BIAS1. The transistor 86 thus operates as a current source to source a bias current Ib into the current summing node 85.

In one embodiment for generating the bias voltage BIAS1, the gate of transistor 86 is coupled to the gate of transistor 34' (see, FIG. 4). The transistors 34' and 86 accordingly form a current mirror circuit. Transistor 86 has a size scaled to be a small fraction of the size of transistor 34'. In the current mirror configuration, the transistor 86 accordingly generates the current Ib which is a fractional replica of the current Isupp which is supplied by transistor 34' to the crystal oscillator 30.

Figure 6:
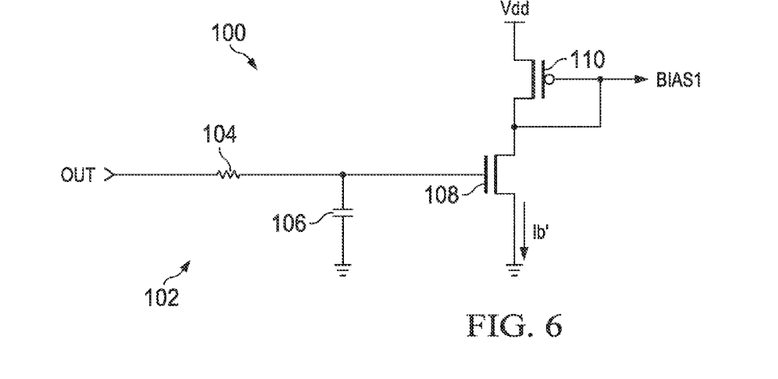
FIG. 6 is a circuit diagram for an embodiment of a bias voltage generator circuit.

Reference is now made to FIG. 6 which illustrates another embodiment for a bias voltage generator circuit 100 to generate the bias voltage BIAS1. The circuit 100 includes a low pass filter 102 formed by a resistor 104 and capacitor 106. The filter output is coupled to the gate of an n-channel MOSFET transistor 108 whose source terminal is coupled to the ground reference node. The transistor 108 generates a current Ib' which is proportional to the filtered voltage of the oscillating output signal OUT. Transistor 108 has a size scaled to be a small fraction of the size of transistor 32 (see, FIG. 4). Transistor 108 has its source terminal coupled to the ground reference node. With the gate connection through filter 102 to the gate of transistor 32, the transistors 32 and 108 form a current mirror and the current Ib' is a fractional replica of DC component of the current Iosc. During oscillation the DC bias at the gate of transistor 32 starts decreasing. Hence, in order to generate a bias which can provide a fraction of the DC current of transistor 32, referred to above as the current Ib', the low pass filter 102 functions to obtain the DC bias and generate a bias for the p-channel transistor 108 that can be used to mirror a fraction of this current.

The circuit 100 further comprises a p-channel MOSFET 110 whose source-drain path is coupled in series with the source-drain path of the transistor 108. The drain terminal of transistor 110 is coupled to the gate of transistor 110, with the bias voltage BIAS 1 generated at the gate terminal. The source terminal of transistor 110 is coupled to the positive supply node and the gate of transistor 110 is coupled to the gate of transistor 86 (see, FIG. 5). The transistors 110 and 86 accordingly form a current mirror circuit. In the current mirror configuration, the transistor 86 accordingly generates the current Ib which is a replica of the current Ib' (subject to scaling in accordance with the relative sizes of transistors 110 and 84 to each other). The size relationship is so chosen such that (Ib/Ib')*(Ib'/(Iosc,dc))=(Im,dc)/(Iosc,dc); i.e., Ib=Im,dc.

Reference is once again made to FIG. 5. The comparison circuit 80 is further coupled to receive a reference current Iref generated by a reference current source 88 coupled between the positive supply node and the current summing node 85. The reference current Iref is sourced into the current summing node 85 and added to the current Ib to generate the current Icomp.

The comparison circuit 80 is selectively actuated by the operation of the rectifying circuit 74 so that current comparison is performed at node 84 during only one half-cycle of the oscillating output signal OUT. When the transistors 76 and 78 of the rectifying circuit 74 are both turned off (by the oscillating output signal OUT (and thus the clock signal CLK) being logic low), the current comparison node 84 is isolated from the current summing node 85 and isolated from transistor 82 and no current comparison is performed at the current comparison node 84. Conversely, when the transistors 76 and 78 of the rectifying circuit 74 are both turned on (by the oscillating output signal OUT (and thus the clock signal CLK) being logic high), the currents Im and Icomp are present at the current comparison node 84.

The current comparison node 84 accordingly functions, only when the oscillating output signal OUT is logic high, to compare the current Im to the current Icomp (wherein Icomp=Iref+Ib). The result of that current comparison affects the charge stored by capacitor 90 and provides the voltage for the control signal SC. The capacitor 90 has a first terminal coupled to the drain terminals of transistors 76 and 78 and a second terminal coupled to the ground supply node.

The relationship between the average values of Im and Icomp (Icomp=Ib+Iref) will set the maximum amplitude of the oscillating output signal OUT. To begin with, when there are no oscillations or very small amplitude oscillations, the current Icomp entering the comparison node will exceed the current Im. As a result, the capacitor 90 will be charged to the positive supply node voltage (for example, Vdd) and the current controller 64 will ensure, in response to receipt of the control signal SC at high voltage Vdd, that the current equal to the start-up current is forced into transistor 32 by transistor 34' (FIG. 4). As oscillations build up, the current Im grows with increased magnitude of the oscillating output signal OUT. Finally a point is reached where the current Icomp entering the comparison node 84 equals the average value of the current Im. The voltage at the control signal SC then settles to a value such that the current controller 64 causes the transistor 34' to source that amount of current into transistor 32 which is necessary to ensure that oscillation at the desired amplitude is sustained. Thus, the amplitude of oscillation is limited depending on the current Iref since the current Im,dc was set equal to Ib and the average extra current Im due to the positive half cycle of the signal OUT is balanced by the current Icomp. The average extra current Im due to the positive half cycle is proportional to the amplitude of oscillation at the signal OUT, and hence the current Iref will decide the amplitude of oscillation.

Reference is once again made to FIG. 4. The current controller circuit 64 receives the output signal SC and in response thereto generates the control signal Vc for application to the gate terminal of the transistor 34'. The control signal Vc is a bias voltage and the current Isupp supplied by the transistor 34' to the crystal oscillator 30 is a function of the magnitude of the bias voltage.

Figure 7:
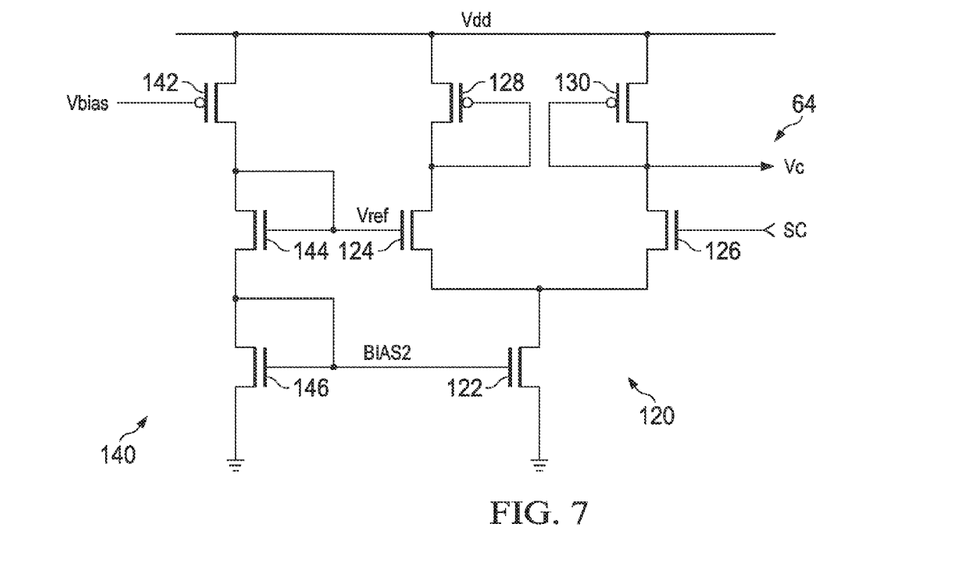
FIG. 7 is a circuit diagram of an embodiment of a current controller.

Reference is now made to FIG. 7 which illustrates a circuit diagram of an embodiment of the current controller 64. The current controller 64 is implemented in this embodiment as an analog control circuit. The current controller 64 includes a conventional differential amplifier circuit 120 including a tail current source (transistor 122) and a pair of differential input transistors 124 and 126. The transistors 122, 124 and 126 are n-channel MOSFET devices. The loads for the differential legs of the amplifier circuit 120 are formed by two p-channel MOSFET transistors 128 and 130, each coupled in a diode-connected configuration. The output of the amplifier circuit 120 is taken at the drain terminal of transistor 126. The gate of transistor 126 (the inverting input of the differential amplifier) is coupled to receive the output signal SC from the current comparator circuit 62. The gate of transistor 124 (the non-inverting input of the differential amplifier) is configured to receive a reference voltage Vref. The gate of the transistor 122 is configured to receive a bias voltage BIAS2 to generate the biasing current for the differential input stage.

The current controller 64 further includes a voltage generation circuit 140. The voltage generation circuit 140 includes a current leg formed by three series connected MOSFET devices. Transistor 142 is a p-channel MOSFET and transistors 144 and 146 are n-channel MOSFETs. The source-drain paths of the transistors 142, 144 and 146 are coupled in series. Transistor 142 functions as a current generator. The gate of transistor 142 is biased by a biasing voltage (Vbias) which can either be such that current through transistor 142 is PTAT or such that the current through transistor 142 is independent of temperature. The transistor 144 is a diode-connected device configured to generate the reference voltage Vref. The transistor 146 is also a diode-connected device configured to generate the bias voltage BIAS2. The current in tail current source 122 is a replica of the current in the current leg of the voltage generation circuit 140 through the current mirror formed with transistor 146.

The differential amplifier circuit 120 functions to compare the output signal SC to the reference voltage Vref and generate the control signal Vc as a function of that comparison. The output signal SC is charged to the positive supply node voltage (Vdd) as stored on capacitor 90 (FIG. 5) when the sensed current Im is relatively lower than Icomp=Iref+Ib (indicating that the amplitude of the oscillating output signal OUT is low). This higher voltage of the signal SC causes a lower voltage of the control signal Vc so that the transistor 34' supplies the start-up current to the oscillator. As the start-up current is provided, oscillations start to build and the amplitude of the oscillating output signal OUT will increase. This is detected by a corresponding increase in the sensed current Im. The current comparison operation responds to the increase in sensed current Im (compared to the reference current Iref) by decreasing the voltage of the output signal SC. This decrease in signal SC, in comparison to the voltage reference Vref causes the differential amplifier circuit 120 to increase the control signal Vc so that the transistor 34' decreases the supply current Isupp.

Figure 8:
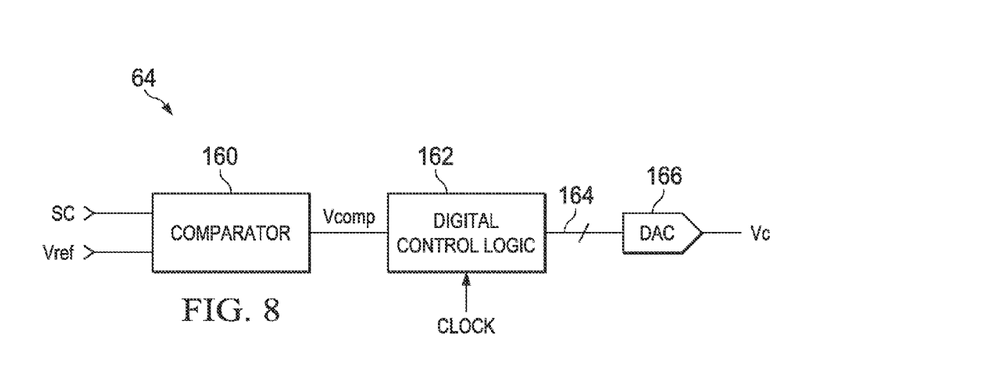
FIG. 8 is a circuit diagram of another embodiment of the current controller.

Reference is now made to FIG. 8 which illustrates a circuit diagram of another embodiment of the current controller 64. The current controller 64 is implemented in this embodiment as a digital control circuit. The current controller 64 includes a comparator circuit 160 operable to compare the output signal SC to a reference voltage Vref. If the output signal SC exceeds the reference voltage Vref, the output of the comparator (Vcomp) has a first logic state. Otherwise, the signal Vcomp has a second logic state. The comparator 160 may implement hysteresis. The current controller 64 further includes a digital control logic circuit 162 which receives the logic signal Vcomp and a clock signal. The digital control logic circuit 142 functions to generate a digital code (a multi-bit digital signal 164) based on the logic state of Vcomp. Vcomp is sampled at some fixed interval (this time depending on the time constant of the oscillator circuit). As long as Vcomp stays at logic high (indicating that the control signal SC voltage exceeds Vref), the value of the code (multi-bit digital signal 164) is decreased. Eventually, when Vcomp is at logic low, the value of the code (multi-bit digital signal 164) is frozen. A digital-to-analog converter (DAC) circuit 166 receives the digital signal 164 and converts that digital signal to the control voltage Vc.

Figure 9:
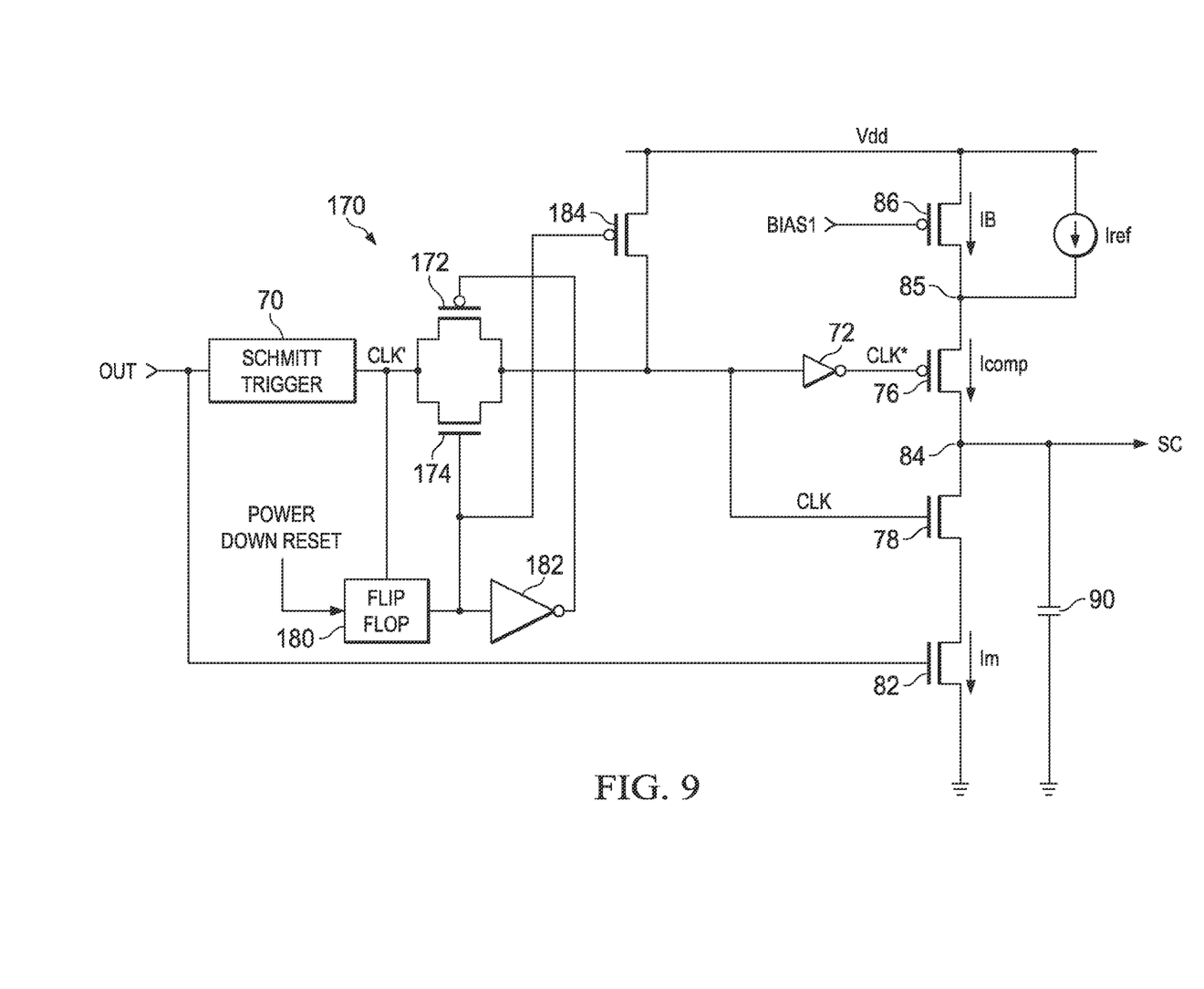
FIG. 9 is a circuit diagram for another embodiment of the current comparator circuit.

Reference is now made to FIG. 9 which shows a circuit diagram for another embodiment of the current comparator circuit 62. Like reference numbers in FIG. 9 refer to like or similar parts in FIG. 5, and discussion of those parts will not be repeated. The oscillating output signal OUT for the crystal oscillator 30 is received at the input of a non-inverting Schmitt trigger circuit 70 which generates a full swing clock signal CLK' in response to the oscillating output signal OUT.

The clock signal CLK' is applied to the input of pass-gate circuit 170 including a p-channel MOSFET 172 and an n-channel MOSFET 174. The transistors 172 and 174 are connected in parallel to each other in a manner well known to those skilled in the art. The output of the pass-gate circuit 170 generates the clock signal CLK. A logic invertor 72 receives the clock signal CLK and generates an inverted clock signal CLK*.

The clock signal CLK' is applied to the clock input of a flip-flop 180. The flip-flop 180 may comprise, for example, a D-type flip-flop as known in the art. The data input of the flip-flop 180 is coupled to receive a logic high signal (for example, the positive supply voltage). The flip-flop 180 is reset by a power down signal. The output of the flip-flop 180 is applied to the gate terminal of the transistor 174. A logic invertor 182 receives the flip-flop output signal and generates an inverted flip-flop output signal. The inverted flip-flop output signal is applied to the gate terminal of transistor 172. The circuit further includes a p-channel MOSFET transistor 184 having a source-drain path coupled between the output of the pass-gate circuit 170 and the positive supply node. The gate terminal of the transistor 184 is coupled to receive the flip-flop output signal.

The pass-gate circuit 170 and flip-flop 180 are provided to ensure that the flip-flop output signal is low (and the inverted flip-flop output signal is high) at start-up of the crystal oscillator 30. With this logic configuration, the clock signal CLK is logic high and the inverted clock signal CLK* is logic low. The output signal SC will accordingly be pulled to logic high (since the total charging current is greater than the discharging current when oscillations have not started) and the maximum supply current Isupp will be provided by transistor 34' to start crystal oscillator 30 operation. After oscillation begins, the flip-flop 180 changes state and pass-gate circuit 170 is actuated.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. An amplitude limiting circuit for a crystal oscillator circuit, comprising:

a current source configured to supply drive current to the crystal oscillator circuit;

a current sensing circuit configured to sense operating current of the crystal oscillator circuit;

a current comparison circuit configured to compare the sensed operating current to a comparison current and generate an output signal; and a current control circuit configured to generate a control signal for controlling operation of the current source in response to said output signal.

2. The circuit of claim 1, further comprising a rectifying circuit responsive to an oscillating output of the crystal oscillator circuit and configured to control operation of the current comparison circuit so that the comparison of the sensed operating current to the comparison current occurs during only one half-cycle of the oscillating output of the crystal oscillator circuit.

3. The circuit of claim 1, wherein the current sensing circuit comprises a sense transistor coupled in a current mirror configuration with an inverting transistor of the crystal oscillator circuit.

4. The circuit of claim 3, further comprising:
   a Schmitt trigger circuit having an input configured to receive an oscillating output of the crystal oscillator circuit and having a control output; and
   a rectifying circuit coupled to said sense transistor and configured to be controlled to selectively couple the sense transistor to a current comparison node in response to said control output during only one half-cycle of the oscillating output.

5. The circuit of claim 4, wherein the current comparison circuit comprises a first current source circuit configured to supply a reference current to said current comparison node, said reference current forming at least a part of said comparison current.

6. The circuit of claim 5, wherein the current comparison circuit further comprises a second current source circuit configured to supply a bias current which is added to said reference current to form said comparison current.

7. The circuit of claim 6, wherein said bias current is a mirror of the supply drive current.

8. The circuit of claim 6, wherein said bias current is derived from the operating current of the crystal oscillator circuit.

9. The circuit of claim 1, wherein the current control circuit comprises a differential amplifier circuit configured to generate the control signal as a function of a difference between the output signal and a reference.

10. The circuit of claim 1, wherein the current control circuit comprises:
    a comparator circuit configured to compare the output signal to a reference;
    a logic circuit configured to generate a digital control signal in response to an output of the comparator circuit; and
    a digital-to-analog converter circuit configured to convert the digital control signal to said control signal.

11. The circuit of claim 1, further comprising a start-up circuit configured to cause the current control circuit to control operation of the current source during start-up to supply drive current to start operation of the crystal oscillator circuit.

12. A circuit, comprising:
    an inverting transistor for a crystal oscillator circuit;
    a first transistor coupled in series with the inverting transistor and configured to supply drive current to the crystal oscillator circuit;
    a second transistor coupled in a current mirror with the inverting transistor to source a sensed current indicative of an amplitude of an oscillating output of the crystal oscillator circuit;
    a third transistor coupled in a current mirror with the first transistor to source a bias current;
    a current source configured to source a reference current;
    a current comparison circuit coupled to compare a sum of the bias current and reference current to said sensed current and generate an output signal responsive to said comparison; and
    a control circuit configured to control operation of the first transistor and control a magnitude of the supply drive current in response to said output signal.

13. The circuit of claim 12, further comprising a rectifying circuit responsive to an oscillating output of the crystal oscillator circuit to control operation of the current comparison circuit so that the comparison occurs during only one half-cycle of the oscillating output of the crystal oscillator circuit.

14. The circuit of claim 12, wherein the current control circuit comprises a differential amplifier circuit configured to generate the control signal as a function of a difference between the output signal and a reference.

15. The circuit of claim 12, wherein the current control circuit comprises:
    a comparator circuit configured to compare the output signal to a reference;
    a logic circuit configured to generate a digital control signal in response to an output of the comparator circuit; and
    a digital-to-analog converter circuit configured to convert the digital control signal to said control signal.

16. A circuit, comprising:
    an inverting transistor for a crystal oscillator circuit;
    a first transistor coupled in series with the inverting transistor and configured to supply drive current to the crystal oscillator circuit;
    a second transistor coupled in a current mirror with the inverting transistor to source a sensed current indicative of crystal oscillator circuit operation;
    a third transistor coupled in a current mirror with the inverting transistor to source a first bias current;
    a fourth transistor coupled in series with the third transistor;
    a fifth transistor coupled in a current mirror with the fourth transistor to source a second bias current;
    a current source configured to source a reference current;
    a current comparison circuit coupled to compare the sum of the second bias current and reference current to said sensed current and generate an output signal responsive to said comparison; and
    a control circuit configured to control operation of the first transistor to set a magnitude of the supply drive current in response to said output signal.

17. The circuit of claim 16, further comprising a rectifying circuit responsive to an oscillating output of the crystal oscillator circuit to control operation of the current comparison circuit so that the comparison occurs during only one half-cycle of the oscillating output of the crystal oscillator circuit.

18. The circuit of claim 16, further including a filter circuit coupled to filter an input to the third transistor in the current mirror with the inverting transistor.

19. The circuit of claim 16, wherein the current control circuit comprises a differential amplifier circuit configured to generate the control signal as a function of a difference between the output signal and a reference.

20. The circuit of claim 16, wherein the current control circuit comprises:
- a comparator circuit configured to compare the output signal to a reference;
- a logic circuit configured to generate a digital control signal in response to an output of the comparator circuit; and
- a digital-to-analog converter circuit configured to convert the digital control signal to said control signal.

* * * * *